(12) United States Patent
Cleland

(10) Patent No.: US 10,847,972 B2
(45) Date of Patent: Nov. 24, 2020

(54) METHOD AND SYSTEM FOR OPTIMIZING POWER GENERATED BY A PHOTOVOLTAIC SYSTEM

(75) Inventor: Thomas Cleland, Sharon (CA)

(73) Assignee: HYBRIDYNE POWER ELECTRONICS INC., Sutton West (CA)

(*) Notice: Subject to any disclaimer, the term of this patent is extended or adjusted under 35 U.S.C. 154(b) by 406 days.

(21) Appl. No.: 13/825,344

(22) PCT Filed: Sep. 23, 2011

(86) PCT No.: PCT/IB2011/002490
§ 371 (c)(1),
(2), (4) Date: May 28, 2013

(87) PCT Pub. No.: WO2012/038828
PCT Pub. Date: Mar. 29, 2012

(65) Prior Publication Data
US 2013/0241294 A1    Sep. 19, 2013

Related U.S. Application Data

(60) Provisional application No. 61/385,702, filed on Sep. 23, 2010.

(51) Int. Cl.
*H02J 1/10* (2006.01)
*H02J 3/38* (2006.01)
*H01L 31/02* (2006.01)

(52) U.S. Cl.
CPC .......... *H02J 1/10* (2013.01); *H01L 31/02021* (2013.01); *H02J 3/383* (2013.01); *Y02E 10/563* (2013.01); *Y10T 307/653* (2015.04)

(58) Field of Classification Search
CPC ........................................................ H02J 1/10
USPC ........................................................... 307/71
See application file for complete search history.

(56) References Cited

U.S. PATENT DOCUMENTS

| 4,175,249 A * | 11/1979 | Gruber ..................... G05F 1/67 136/293 |
| 7,378,757 B2 * | 5/2008 | Nakata ...................... H02J 7/35 307/71 |
| 2009/0121549 A1 * | 5/2009 | Leonard ................ H02M 3/156 307/51 |
| 2010/0139743 A1 * | 6/2010 | Hadar ..................... H02J 3/383 136/251 |
| 2010/0154858 A1 | 6/2010 | Jain |

(Continued)

*Primary Examiner* — Daniel Kessie
(74) *Attorney, Agent, or Firm* — Vedder Price P.C.

(57) ABSTRACT

In one embodiment, a photovoltaic (PV) power generation system includes a plurality of PV arrays coupled to an automatic switchbox that connects the one or more PV arrays in series or in parallel with each other based at least in part on output voltage of the switchbox.
In this embodiment, the automatic switchbox monitors the output voltage and ensures that the output voltage is within a predetermined operational range. If the output voltage exceeds a first predetermined voltage, then the array switchbox electrically couples one or more PV arrays in parallel with each other, which reduces the output voltage within the predetermined operational range. If the output voltage falls below a second predetermined voltage, the switchbox connects one or more PV arrays in series with each other, which increases the output voltage to within the predetermined range.

12 Claims, 11 Drawing Sheets

(56) References Cited

U.S. PATENT DOCUMENTS

| | | | |
|---|---|---|---|
| 2011/0241431 A1* | 10/2011 | Chen | H02J 3/383 |
| | | | 307/71 |
| 2012/0043988 A1* | 2/2012 | Ramsey | H02J 13/00 |
| | | | 324/761.01 |
| 2012/0053867 A1* | 3/2012 | Dunn | H02S 50/10 |
| | | | 702/58 |

* cited by examiner

METHOD AND SYSTEM FOR OPTIMIZING POWER GENERATED BY A PHOTOVOLTAIC SYSTEM

CROSS-REFERENCE TO RELATED APPLICATIONS

This US patent application claims priority to PCT Application No. PCT/IB2011/002490 filed 23 Sep. 2011, and also to U.S. Provisional Patent Application No. 61/385,702 filed on Sep. 23, 2010, the entirety of each of which is incorporated herein by reference.

STATEMENT REGARDING FEDERALLY SPONSORED RESEARCH OR DEVELOPMENT

Not Applicable.

THE NAMES OF PARTIES TO A JOINT RESEARCH AGREEMENT

Not Applicable.

INCORPORATION-BY-REFERENCE OF MATERIAL SUBMITTED ON A COMPACT DISC

Not Applicable.

TECHNICAL FIELD

The present disclosure relates generally to a system and method for dynamically controlling and optimizing an amount of power output from a plurality of photovoltaic arrays.

BACKGROUND

A photovoltaic system (or PV system) is a system that uses photovoltaic solar cells to convert light into electricity. A typical PV system generally consists of multiple components, including PV modules, and an inverter. Generally, the power that one PV module can produce is seldom enough to meet requirements of a home or a business, so the PV modules are connected in series to obtain the desired voltage.

FIG. 1 is a simplified diagram of a typical PV system 100. As shown in FIG. 1, the PV system 100 includes a PV string 102, a PV string 104, an inverter 106, a load 108, and bus lines 110. As shown in FIG. 1, the PV strings 102 and 104 includes a plurality of PV modules 112 (or PV panels 112) connected in series with each other. Each PV string 102 and PV string 104 is in connected in parallel with each and other and each PV string 102 and PV string 104 is individually connected to the inverter 106. The inverter 104 converts the direct current (DC) to alternating current (DC) that can be used to provide power to load 106.

As will be explained with the aid of the drawings that follow, such known arrangements have various drawbacks which are minimized by the present disclosure.

BRIEF SUMMARY

In one embodiment, a photovoltaic (PV) power generation system includes a plurality of PV devices coupled to an automatic switchbox that connects the one or more PV devices in series or in parallel with each other based at least in part on output voltage of the switchbox. In this embodiment or in another embodiment, the output voltage is an aggregate voltage of all the PV devices coupled to the switchbox.

In one embodiment, the automatic switchbox (referred to as switchbox) monitors the output voltage and ensures that the output voltage is within a predetermined operational range. If the output voltage exceeds a first predetermined voltage, then the array switchbox electrically couples one or more PV devices in parallel with each other, which reduces the output voltage within the predetermined operational range. If the output voltage falls below a second predetermined voltage, the switchbox connects one or more PV devices in series with each other, which increases the output voltage to within the predetermined range. In one embodiment, the PV device is a device that converts light into electricity. In one embodiment, the PV device is a PV array including PV strings. In an alternative embodiment, the PV device is a PV string.

In another embodiment, a switchbox for combining one or more PV components in series or in parallel with each other in a photo-voltaic (PV) power generation system is provided. In this embodiment, the switchbox includes an input portion, an output portion, and a pair of bus lines coupling the input portion to the output portion, wherein the input portion is capable of receiving power from a plurality of PV devices. The switchbox also includes a voltage sensor coupled to the pair of bus lines at the output portion. Further, the switchbox includes a first plurality of nodes for coupling one or more PV devices either in parallel or in series with each other based at least in part on the output voltages, wherein each node is associated with any two PV devices.

In an alternative embodiment, the switchbox further comprises a node controller for controlling the nodes based at least in part on the voltage sensed by the voltage sensor at the output portion, wherein the node controller is electrically coupled to the voltage sensor and to the first plurality of nodes.

In one embodiment, the pair of bus lines includes a positive direct current (DC) bus line and a negative DC bus line, and wherein the negative DC bus line is capable of receiving power generated from the plurality of PV devices. In one embodiment, the input portion comprises a plurality of input links and a corresponding plurality of output input links, wherein each input link and corresponding output link is associated with a PV device. In addition, each node is connected to an input DC link of one PV device and an output DC link of another PV device and the voltage sensor is connected to the pair of bus lines at the output portion.

The switchbox, in one embodiment includes, n nodes and (n+1) PV devices. In effect, an $n^{th}$ node is connected to both an output link of an $n^{th}$ PV device and an input link of an $(n+1)^{th}$ PV device.

In one embodiment, the $n^{th}$ node is configured to selectively couple the output link of the $n^{th}$ PV device either to the negative DC bus line or to the input link of the $(n+1)^{th}$ PV device and the $n^{th}$ node is also configured to selectively connect either the input link of the $(n+1)^{th}$ PV device to the positive bus line or disconnect the input link of the $(n+1)^{th}$ PV device from the positive bus line.

In this embodiment or in an alternative embodiment, the $n^{th}$ node is configured to operate in at least one of two states an active state or a rest state. In the active state, the $n^{th}$ PV device is connected in parallel with one or more PV devices. In particular, wherein when the $n^{th}$ node is in the active state, the output link of the $n^{th}$ PV device is coupled to the negative bus line and the input link of the $(n+1)^{th}$ PV device is coupled to the negative bus line.

In the rest state, the $n^{th}$ PV device is connected in series with one or more PV devices. In particular, when the $n^{th}$ node is in the rest state, the output link of the $n^{th}$ PV device is coupled to the input link of the $(n+1)^{th}$ PV device and the input link of the $(n+1)^{th}$ PV device is disconnected from the positive bus line.

In any of these embodiment, at least one node includes at least one double pole relay switch comprising a first contact and a second contact, wherein the first contact and the second contact are interlocked so that they move in unison. In this embodiment, the first contact of an $n^{th}$ node is connected to the output link of the $n^{th}$ PV device and the second contact of an $n^{th}$ node is connected to the input link of the $(n+1)^{th}$ PV device.

The first contact of an $n^{th}$ node is configured to selectively couple the output link of the $n^{th}$ PV device either to the negative DC bus line or to the input link of the $(n+1)^{th}$ PV device and second contact of an $n^{th}$ node is configured to selectively either connect the input link of the $(n+1)^{th}$ PV device to the positive bus line or disconnect the input link of the $(n+1)^{th}$ PV device from the positive bus line. In this embodiment, the first contact of an $n^{th}$ node is coupled to the negative bus line, the interlocked second contact of the $n^{th}$ node is coupled to the positive bus line, the $n^{th}$ PV device is connected in parallel with one or more PV devices, and when the first contact of an $n^{th}$ node is coupled to the input link of the $(n+1)^{th}$ PV device, the interlocked second contact is disconnected from the positive bus line, the $n^{th}$ PV device is connected in series with one or more PV devices.

In any of the embodiments disclosed, the plurality of PV devices are a plurality of devices that convert light into electricity. In one embodiment, the plurality of PV devices are PV arrays, which in turn include a plurality of PV strings. In another embodiment, the plurality of PV devices are PV strings.

In one embodiment, a method for switching or connecting one or more PV devices in series or in parallel includes monitoring an output voltage for a plurality of PV devices at a pair of bus lines, wherein the output voltage is an aggregate voltage generated by the plurality of PV devices. The method further includes when the output voltage is greater than a first predetermined value, connecting one or more PV devices in parallel with each other and when the output voltage is less than second predetermined value, connecting one or more PV devices in series with each other.

In one embodiment, the plurality of PV devices comprises a plurality of devices that convert light into electricity, the plurality of PV devices are selected from the group consisting of PV arrays and PV strings, at least one PV device includes an input link and output link, wherein the pair of bus lines comprises a positive DC bus line and a negative DC bus lines, wherein the plurality of PV devices are connected in series or in parallel each other at a plurality of nodes, and a quantity of the first plurality of nodes comprises n nodes, and a quantity of PV devices comprises (n+1) PV devices; and an $n^{th}$ node is connected to both an output link of an $n^{th}$ PV device and an input link of an $(n+1)^{th}$ PV device.

In one embodiment, the method includes when the output voltage is greater than a first predetermined value, connecting one or more PV devices in parallel with each other comprises selecting a node and then connecting, at the selected node, one or more PV devices associated with the selected in parallel with each other, wherein selecting the node is selected at random.

In this embodiment or in alternative embodiment, the method includes wherein when the output voltage is less than second predetermined value, connecting one or more PV devices in series with each other comprises selecting a node and then connecting, at the selected node, one or more PV devices associated with the selected in series with each other, wherein the node is selected at random.

In one embodiment, connecting one or more PV devices in parallel with each other comprises coupling the output link of the $n^{th}$ PV device to the negative bus line coupling the input link of the $(n+1)^{th}$ PV device to the negative bus line. In the same embodiment, connecting one or more PV devices in series with each other comprises coupling the output link of the $n^{th}$ PV device to the input link of the $(n+1)^{th}$ PV device and disconnecting the input link of the $(n+1)^{th}$ PV device from the positive bus line.

In yet another embodiment, when the output voltage is greater than a first predetermined value, connecting one or more PV devices in parallel with each other comprises when the output voltage is greater than 550 volts, connecting one or more PV devices in parallel with each other. And when the output voltage is less than second predetermined value, connecting one or more PV devices in series with each other comprises when the output voltage is less than 350 volts.

BRIEF DESCRIPTION OF THE DRAWINGS

These and other features, aspects, objects, and advantages of the embodiments described and claimed herein will become better understood upon consideration of the following detailed description, appended claims, and accompanying drawings where:

Like reference numerals will be used to refer to like or similar parts from figure to figure in the following detailed description of the drawings.

DETAILED DESCRIPTION OF THE DRAWINGS

Figure 2:
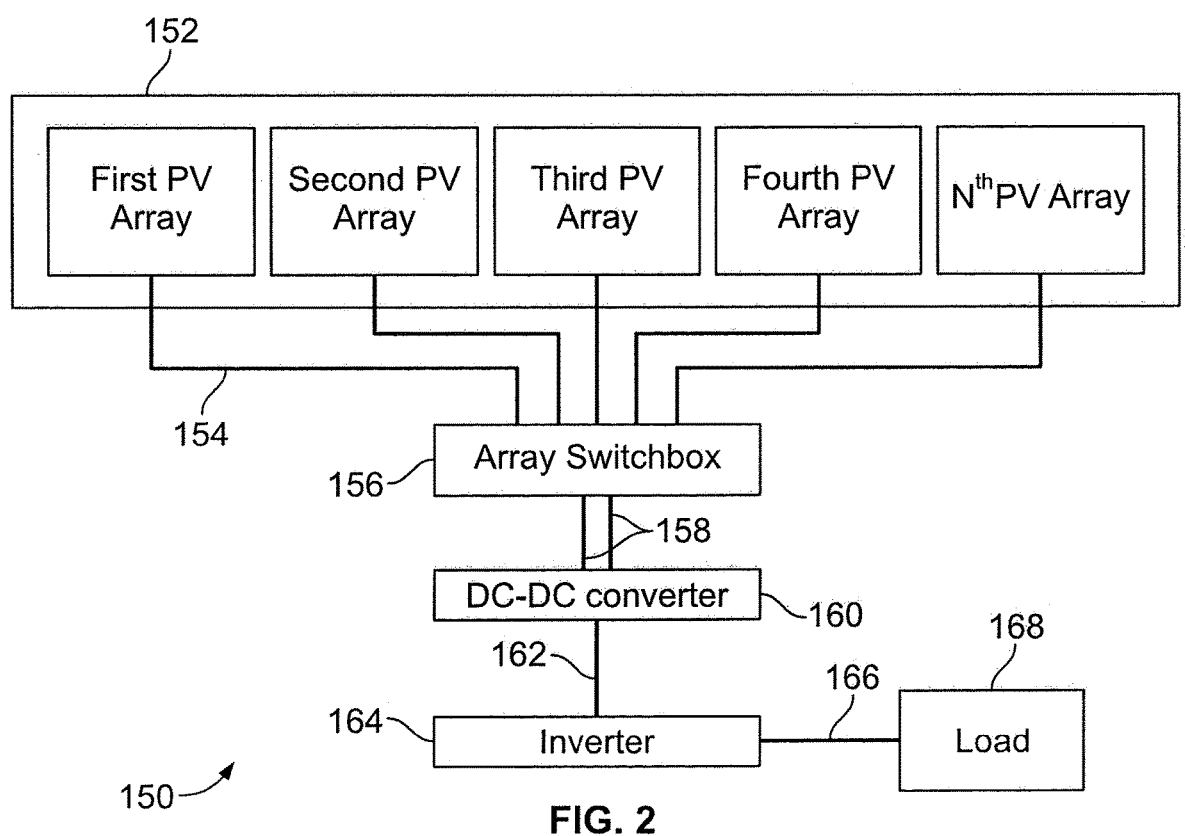
FIG. 2 is a block diagram of a Proportional Reactive Optimizing Photovoltaic Power System (PROPPS) according to an exemplary embodiment.

FIG. 2 illustrates an exemplary embodiment of a Proportional Reactive Optimizing Photovoltaic Power System (PROPPS) 150. As shown in FIG. 2, the PROPPS 150 includes a plurality of PV arrays 152 (hereinafter referred to as PV arrays 152), a plurality of DC links 154 and array switchbox 156, a pair of bus lines 158, a DC to DC converter ("DC-DC converter") 160, an inverter link 162, an inverter 164, a load link 166 and a load 168.

As shown in FIG. 2, the PV arrays 152 are electrically coupled to the array switchbox 156 via the plurality of DC links 154. The array switchbox 156 is in turn electrically connected to the DC-DC converter 160 via the pair of bus lines 158. And the DC-DC converter 160 is in turn connected to the inverter 164 via the inverter link 162. The inverter 164 is electrically connected to the load 168 via the load link 166.

Before proceeding to a discussion of how the PROPPS 150 operates, the definition, the definition of a PV array should generally be noted. Each PV array in the PV arrays 152 is configured to selectively connect to either the pair of bus lines 158 or to another PV array in the plurality of PV arrays. Each PV array includes a plurality of PV strings and each PV string in each PV array in turn includes a plurality of PV panels (or PV modules) and each PV module or PV panel includes a plurality of PV solar cells. In one embodiment, the PROPPS 150 includes 42 PV arrays, wherein each PV array includes 2 PV strings, and each PV string includes 20 PV modules (i.e., PV panels), and each PV module/panel includes a plurality of solar cells. In this regard, it should be noted that the array switchbox 156 is connected to a PV arrays 152 and not to PV strings or to PV modules.

In operation, the PV arrays 152 receive light. The received light is converted into electricity and transferred to the array switchbox 156 via the plurality of DC links 154. The array switchbox 156 outputs an output voltage at the pair of bus lines 158. The output voltage at the pair of bus lines 158 is transferred to the DC-DC converter 160. The DC-DC converter 160 is an electronic circuit which converts the source of direct current from one voltage level to another as a class of power converter. The power produced by the DC-DC converter 160 is transferred to the inverter 164. The inverter 104 converts DC power to AC power that can be used to provide power to load 168.

Figure 1:
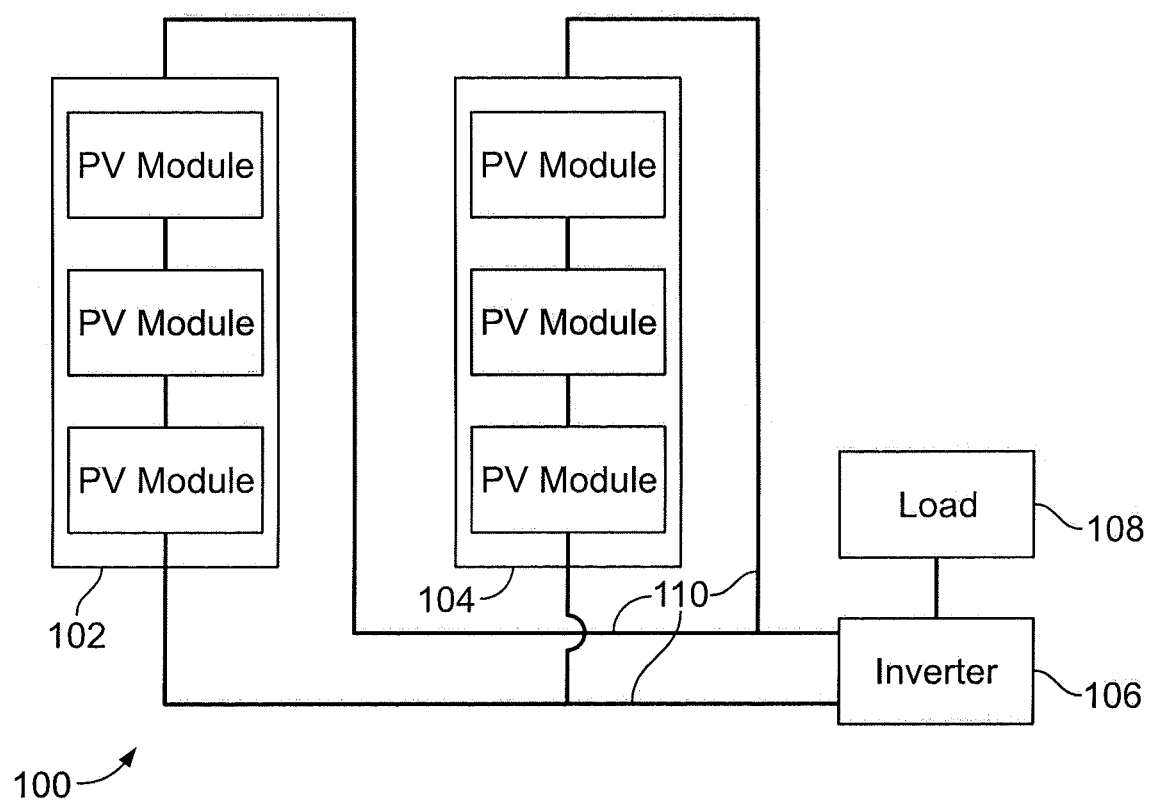
FIG. 1 is a block diagram of a conventional photovoltaic power generation system known in the prior art.

One of the drawbacks of typical PV systems, like the one depicted in FIG. 1, is that they are unable to adjust and optimize the amount of power output to the inverter 106. In particular, because the PV strings 102 and 104 are hardwired to the bus lines 110, there is very little flexibility in adjusting and optimizing the amount of power output received by the inverter 106. The hardwired connections between each of the PV strings 102 and 104 and inverter 106 prevent the PV system 100 from reconfiguring its connections based on the power output to the inverter.

The array switchbox 156 is explained more fully in connection with FIGS. 3 to 6 but it should be noted as a general matter that the array switchbox 156 functions to combine one or more PV arrays 152 in series or in parallel with each other based at least in part on the output voltage at the pair of bus lines 158. In one embodiment, the array switchbox 156 continuously senses and monitors the output voltage at the pair of bus lines and ensures that the output voltage is within a predetermined operational range.

If the output voltage at the pair of bus lines 158 exceeds a first predetermined voltage within the predetermined operational range, then the array switchbox 156 electrically couples one or more PV arrays 152 in parallel with each other. By connecting one or more PV arrays 152 in parallel with each other, the array switchbox 156 effectively reduces the output voltage at the pair of bus lines 158. The array switchbox 156 continues to electrically connect the PV arrays 152 in parallel with each other until the output voltage at the pair of bus lines 158 is within the predetermined operational range.

On the other hand, if the output voltage at the pair of bus lines 158 falls below a second predetermined voltage within the predetermined operational range, the array switchbox 156 connects one or more PV arrays 152 in series with each other. By connecting one or more PV arrays in series with each other, the array switchbox 156 effectively increases the output voltage produced at the pair of bus lines 158. The array switchbox 156 continues to connect or electrically couple one or more PV arrays 152 in series with each other until the output voltage at the pair of bus lines 158 is within the predetermined operational range.

In one embodiment, the array switchbox 156 has a predetermined operational range of 300 volts to 600 volts, wherein the first predetermined voltage is 550 volts and the second predetermined voltage is 350 volts. In this embodiment, if the output voltage at the pair of bus lines 158 exceeds 550 volts, then the array switchbox 156 connects one or more PV arrays in parallel with each other until the output voltage at the pair of bus lines 158 is below 550 volts. On the other hand, if the output voltage at the pair of bus lines 158 falls below 250 volts and the array switchbox 156 connects the one or more PV arrays in series with each other until the output voltage at the pair of bus lines 158 is within the operational voltage range and increases over and above 250 volts.

In this embodiment or in a different embodiment, the predetermined operational range of the array switchbox 156 is set to match an operational range of the inverter 164 By matching the operational range of the inverter 164 with the predetermined operational range of the array switchbox 156, the PROPPS 150 ensures that power provided by the array switchbox 156 does not exceed the safety ratings of the inverter 164. In effect, the PROPPS 150 ensures that the inverter 164 operates within its safety ratings.

It should understood that FIG. 2 is only an exemplary embodiment of the PROPPS 150. The PROPPS 150 may include additional or other components not shown in FIG. 2. For instance, in another embodiment, PROPPS 150 includes additional PV arrays 152 and one or more array switchboxes 156. As another example, the array switch box 156 is directly coupled to the inverter 164. In this embodiment, the PROPPS 150 does not include a DC-DC converter.

In yet another embodiment, as discussed in connection with FIGS. 7 and 8, PROPPS 150 includes a PV string switchbox which switches one or more PV strings in series or in parallel with each other. may In one embodiment, the PROPPS 150 may include 42 PV arrays wherein each PV array includes two PV strings and each PV string in turn includes 20 PV panels or PV modules.

Figure 3:
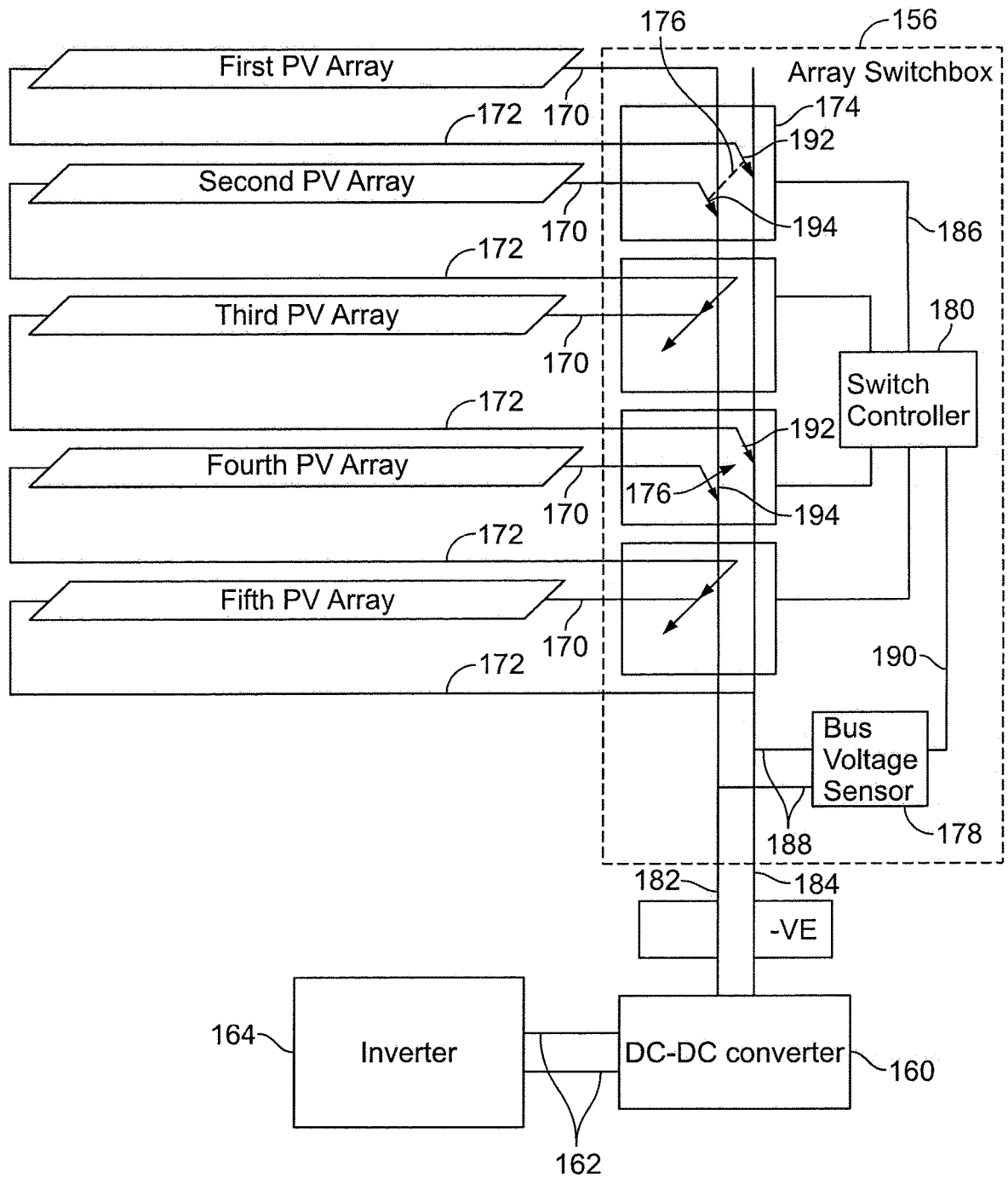
FIG. 3 is a block diagram of the PROPPS showing the inner components of an array switchbox.

Turning next to FIG. 3, FIG. 3 illustrates the electrical connections between the PV arrays 152 and the inner-components of the array switchbox 156. As shown in FIG. 3, the PROPPS 150 includes a plurality of DC input links 170, a plurality of DC output links 172, a plurality of nodes 174, a plurality of relay switches 176, a plurality of controller links 186, a node controller 180, an output sensor link 190, a bus voltage sensor 178, a pair of sensor links 188, the pair of bus lines 158 (of FIG. 2), which in turn includes a positive bus line 182 and a negative bus line 184. FIG. 3 also includes the same components illustrated in FIG. 2 which include the DC-DC converter 160, the inverter link 162 and the inverter 164.

In the embodiment shown, the plurality of nodes 174 is electrically coupled to the switch controller 180 via the plurality of controller links 186. The bus voltage sensor 178 is electrically coupled to the switch controller 182 via the output sensor link 190 and the bus voltage sensor 178 is electrically connected to the positive bus line 182 and the negative bus line 184. Each PV array 152 has a corresponding DC input link 170 and a corresponding DC output link 172. The PV arrays 152 are arranged such that the input DC link 170 for the first PV array is connected to the positive bus line 182 and the output DC link 172 for the $n^{th}$ PV array 152 is connected to negative bus line 184.

Further, in the embodiment shown in FIG. 3, each node 174 includes a relay switch 176. In one embodiment, the relay switch 176 is a double pole double throw relay switch. It should be understood that the double-throw double-pole switches they are just drawn differently for representation purposes, depending on operational state depicted, as indicated in the diagrams In all cases, in an activation, point 192 moves to the contact point above 194, and the contact at 194 opens on the +ve line, so that a series connection is made. Which has the effect of putting line 172 in series with 170 and so on. As shown in FIG. 3, each relay switch 176 includes at least a first contact 192 and a second contact 194. The first contact 192 and the second contact 194 are interlocked so that the first contact 192 and the second contact 194 move in unison. This means that if the first contact 192 is open, the second contact 194 is also open. And if the first contact 192 is closed, then the second contact 194 is also closed.

In the embodiment shown in FIG. 3, each node 174 is associated with a pair of PV arrays 152 such that the number of nodes 174 is one less than the number of PV arrays 152. Accordingly, in this embodiment, if there are n PV arrays 152, there are n−1 nodes 174. Alternatively, if there are n nodes 174, then there are n+1 PV arrays 152.

As shown in FIG. 3, the first node 174 is associated with the first and second PV arrays 152, the second node 174 is associated with second and third PV arrays 152, the third node 174 is associated with the third and fourth PV arrays 152, and the fourth node 174 is associated with the fourth and fifth PV arrays 152.

In an exemplary embodiment, the first node 174 is electrically coupled to both: 1) the DC output link 172 of the first PV array 152 and 2) the DC input link 170 of the of the second PV array 152. The second node 174 is electrically coupled to the DC output link 172 of the second PV array 152 and to the input DC link 170 of the third PV array 152. Similarly, the third node 174 is electrically connected to the output DC link 172 of the third PV array 152 and to the DC input link 170 of the fourth PV array 152. In this regard, any $n^{th}$ node 174 is electrically coupled to the output DC link 172 of the $n^{th}$ PV array 152 and is coupled to the input DC link 170 of the $(n+1)^{th}$ PV array 152. In this embodiment, the connections between a node and the input and output DC links 170 and 172 respectively are between first and second contacts 192 and 194 of that node. In particular, the output DC link 172 is electrically connected to the first contact 192 of its corresponding node 174 and the input DC link 170 is connected to the second contact 194 of its corresponding node 174. To illustrate, the first contact 192 of the first node 174 is coupled to the output DC link 172 of the first PV array 152 and the second contact 184 of the first node 174 is coupled to the input DC link 170 of the second PV array 152. In this regard, the first contact 192 of an $n^{th}$ node 174 is electrically coupled to the output DC link 172 of the $n^{th}$ PV array 152 and the second contact 194 of the $n^{th}$ node 174 is electrically coupled of the input DC link 170 of the $(n+1)^{th}$ PV array 152.

In the embodiment shown, the first contact 192 of any given node 174 is connected to the DC output link 172 and the second contact 194 of any given node 174 is connected to the DC input link 170. Each contact is associated with its respective bus line. As shown in FIG. 3, the first contact 192 is associated with negative bus line 184. And the second contact 194 is associated with the positive bus lines 182. The first contact 192 of any given node connects its corresponding output DC link 172 to the negative bus line 184. And the second contact 194 of any given node connects its corresponding input DC link 170 to the positive bus line 182.

In an exemplary embodiment, each node 174 can be in one of two states: an active state and a rest state. When a node 174 is in an active state, the first and second contacts 192 and 194 are connected to their corresponding bus lines 182 and 184: the first contact 192 is connected to the negative bus line and the second contact 194 is connected to the positive bus line 182. When a node 174 is in a rest state, the first contact 192 is connected to its corresponding DC input link 172 and the second contact 194 is left open. As shown in FIG. 3, the first and third nodes 174 are in an active state and the second and nth nodes 174 are in a rest state. In this state, the output DC link 172 of the second array is connected to the input DC link 170 of the third array. In effect, the arrangement shown in FIG. 3 is such that the second and third PV arrays 152 are connected in series with each other. This series combination of the second and third PV arrays 152 is then connected in parallel with the first and the $n^{th}$ PV arrays 152.

In one embodiment, the relay switches 176 are electromechanical relay switches. In this embodiment, the electromechanical relay switches are socketed (for ease of replacement) latching type, 12V DC activation which means that once they have achieved the desired state, they require no power (coil does not require energization to maintain state) to maintain it.

Additionally, if the operational range of the inverter is within 300V to 600V, the contacts of each relay must be rated for 600V DC. The activation of these relay switches may be via an node controller 180 (addressable node (microprocessor) on the AI network, that will only be live when there is some power in the network, The expert system will self calibrate and continually optimize itself, based on the number of nodes connected to the array network, and how the nodes perform.

In an alternative embodiment, the relay switches 176 are solid state relay switches, a Bi-stable element type device must be used, MOS, or FET type which may require infinitesimally small amounts of current or voltage to remain stable in the desired state, additionally a Solid state solution of this type must be individually battery backed up using a small rechargeable Lithium-Ion (or equal) battery unit so that the switch circuit remains powered at night, and states remain constant during instantaneous reductions in power, so that when a instantaneous reduction occurs, the relays all return to "rest position, (series connection) in preparation for resumption of power, their activation will be via an addressable node (microprocessor) on the AI network, that will only be live when there is some power in the network. The expert system will self calibrate and continually optimize itself, based on the number of nodes connected to the array network, and how the nodes perform.

Figure 4:
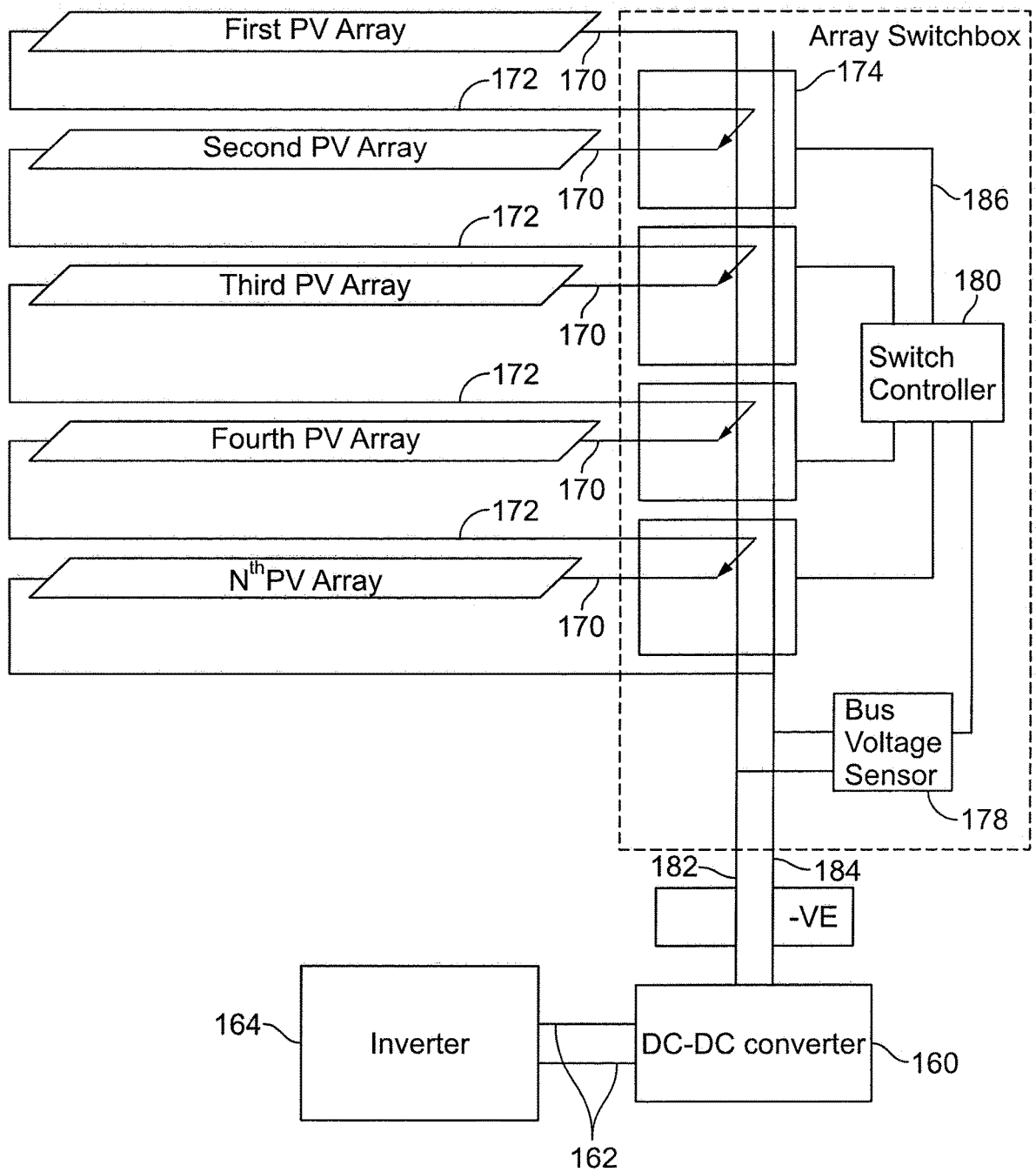
FIG. 4 is a block diagram of the PROPPS showing one possible configuration of how the PV arrays are connected.
Figure 5:
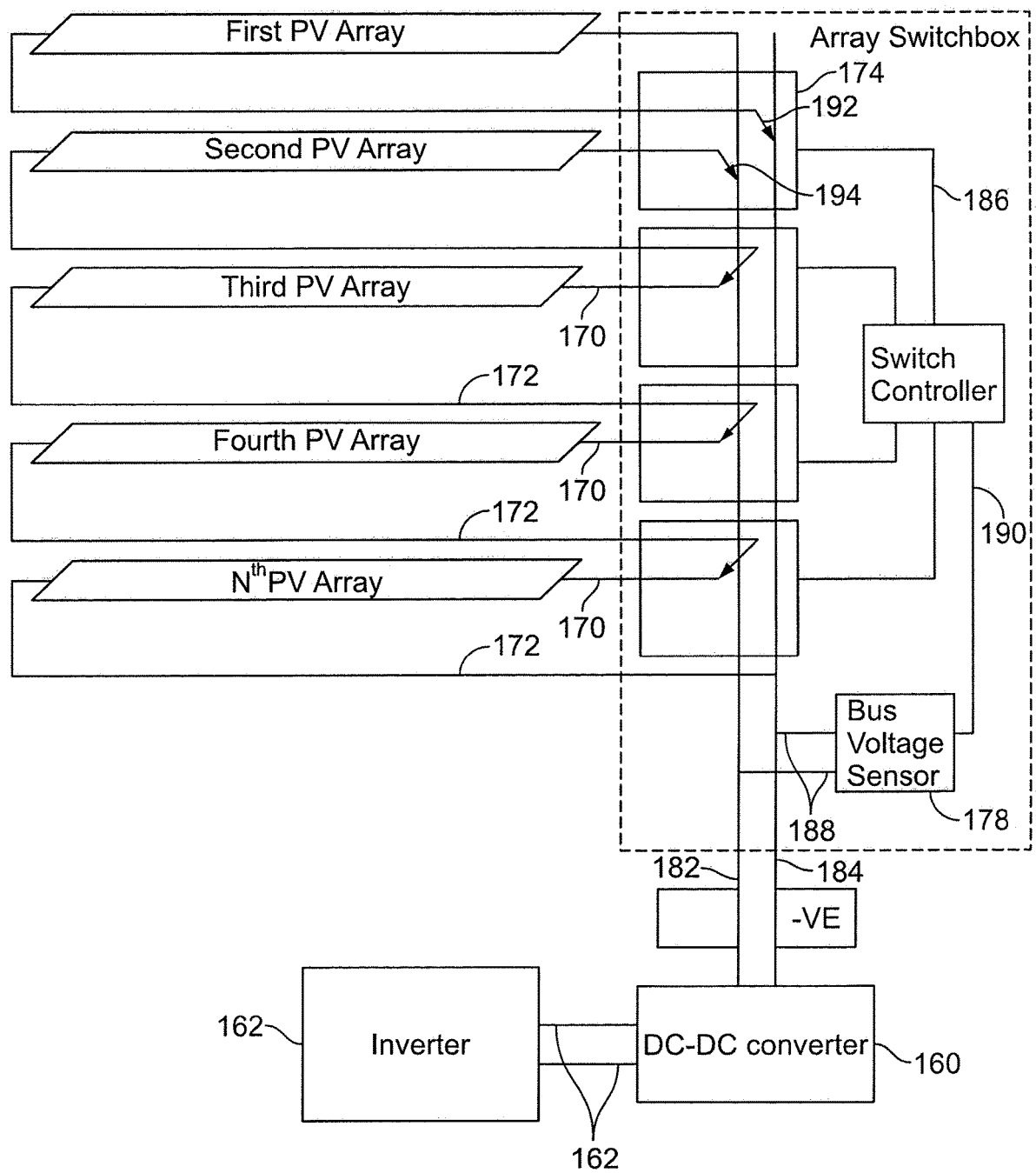
FIG. 5 is a block diagram of the PROPPS showing another possible configuration of how the PV arrays are connected.
Figure 6:
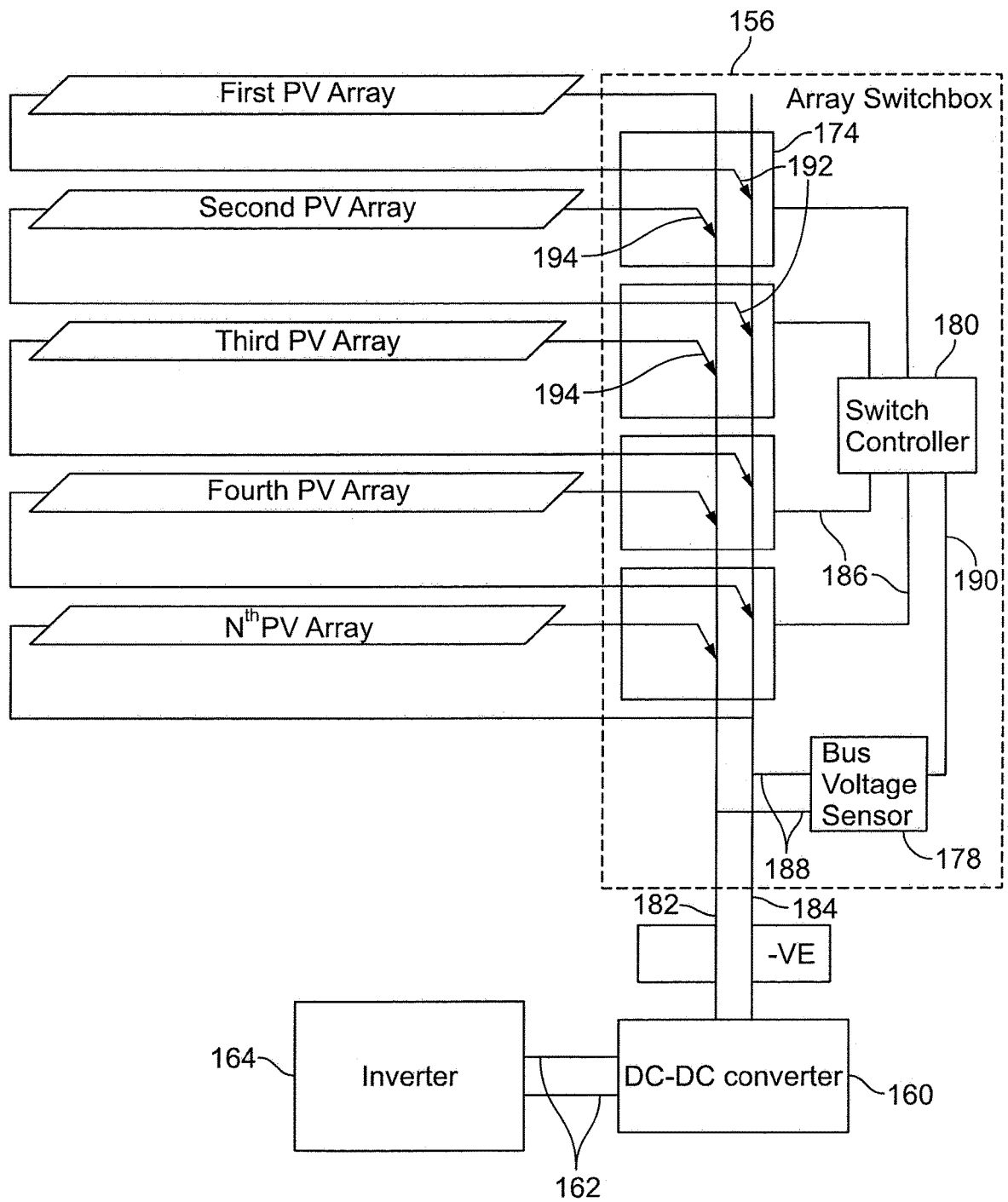
FIG. 6 is a block diagram of the PROPPS is a block diagram showing yet another configuration of how the PV arrays are connected.

It should be understood that the plurality of nodes 174 may be in any combination of rest and active states and therefore, the plurality of arrays 152 may be connected in any combination of series and parallel configurations. FIGS. 4 through 6 illustrate different scenarios in which the nodes connect any one of the PV arrays 152 in series or in parallel with each other. For instance, as shown in FIG. 4, all of the nodes 174 are in rest state where the first contact 192 for each node links it associated output DC link 172 with its input DC link 170. In this regard, all of the PV arrays 152 are connected in series with each other. FIG. 5 illustrates another configuration in which the second, third, and nth nodes 174 are in rest state and the first node 174 is in active state. In this regard, the third, fourth, and nth PV arrays 152 are connected in series with each other. This series combination (of the third, fourth, and nth PV array) is in turn connected in parallel with the first and second PV arrays 152. FIG. 6 illustrates yet another configuration in which all of the nodes 174 are in active state. In this state, all of the PV arrays 152 are connected in parallel with each other.

In one embodiment, the node controller 180 the controller is a microprocessor based system, using heuristic algorithms, which is otherwise called an "expert system", which means simply that the system will "learn to optimize itself, based on the events of any given day, and will ultimately begin to work predictively in anticipation of similar events that are initiated or started the same way on some previous occasion. The node controller 180 includes a microprocessor and data storage medium for storing algorithms and data associated with nodes 174, the states of the nodes 174, the time and date associated with any node 174 state change, and errors associated with any nodes 174. Data storage medium associated with node controller 180 can store other data as well.

In this embodiment or in alternative embodiment, the node controller 180 employs an 'expert system.' In this embodiment, the expert system is a software-based system using heuristic learning algorithms (artificial intelligence) allowing the system to learn from past inputs and results of the applications of algorithms using those inputs, utilizing aspects of functional approximation techniques in parameter estimation procedures, applied on array power optimization, fault detection and isolation tasks using back propagation neural networks as functional approximation devices. This strategy uses a data selection task as applied to the determination of non-conventional process parameters, such as performance and system-efficiency indexes, and tabulation which are difficult to acquire and thereby create by direct measurement. This is all carried out with the aid of the facilities supplied by commercial neural network toolboxes, (expert system software) which manage databases, neural network structures and highly efficient training algorithms.

In one embodiment, the communication between the node controller and the nodes 174 and the communication between the node controller 180 and the bus voltage sensor 178 may be done with FM Muxed-Demuxed signals transposed on a DC power links between the PV arrays 152 and the control nodes 174. The nodes 174 in one embodiment are uniquely addressed and able to receive commands or it is transposed link system which is also acting as a data acquisition sensors to the expert system and in node controller 180.

In operation, the bus voltage sensor 178 is continuously sensing the output voltage of the array switch box 156 via the sensor links 188. The data relating to the sensed voltage is transferred to the node controller 180 via the output sensor link 190. The node controller 180 keeps track of the state of all of the nodes 180 in the array switch box 156. If the sensed voltage exceeds a first predetermined voltage, the node controller 180 sends command signals to one or more nodes 174. The command signals change the state of at least one node 174 to an active state. In doing so, the node controller 180 connects at least two PV arrays 152 (or at least two sets of PV arrays 152) in parallel with each other. On the other hand, if the sensed voltage falls below a second predetermined voltage, the node controller 180 send commands signals to one or more nodes 174 instructing the nodes to change from an active state to rest state. In doing so, the node controller 180 connects at least two PV arrays 152 (or at least two sets of PV arrays 152) in series with each other.

In one embodiment, if the inverter operational voltage range is 300-600V (where the median is 450V), and if multiple PV strings connected to PV arrays 152, and if all nodes 174 are at rest (e.g., at night, all relays connected to each array are in the normally closed (deactivated)) position, AND if the configuration of the PV arrays 152 is a result of this at rest condition, then the node controller 152 connects all of the PV arrays in series with each other. In doing so, all available voltage (multiplied by number of series connections) from every array is presented to the DC buss of the DC-DC converter which is then connected to the inverter 164.

The PV arrays 152 are connected in series or in parallel with each other based at least in part on the output voltage of the array switchbox 156 (as sensed by the bus voltage sensor 178). Many different scenarios exist as to why the output voltage of the array switchbox 156 may change over a period of time. A few different conditions associated with these scenarios and the resulting PV array configuration are explained in below.

A morning operation sequence begins when each PV array is generating 10 V. If there are 42 PV arrays in PROPPS 150, then the total voltage produced by the all of the PV arrays is 420 volts. Under this condition, the inverter 164 will be operating in midrange of DC window, albeit at low power and low efficiency (low power), similar to its operation as if only one array/string were connected, or approximately 6 Kw. The configuration of PV arrays, when all of the PV arrays is illustrated in FIG. 4.

As the sun rises, the intensity increases to 20V per PV array. In one embodiment, if there are 42 PV arrays, then the total voltage, if all of the PV arrays remained in series, would be 840V, which would exceed the maximum safety rating the insulation at the inverter 164. The node controller 180 will, however, sense the DC voltage rising, and when it approaches a first predetermined voltage, the node controller 180 begins to connect (switch) some of the PV arrays 152 to parallel operation. As the PV arrays are connected in parallel, the voltage drops to ~420V, and the output will be approximately 12 Kw. This configuration is illustrated in FIG. 3. In one embodiment, the first predetermined voltage is 550 Volts.

As sun continues to rise, the intensity increases to 30V per PV Array. If the PV arrays 152 remained in series, then the total PV array voltage would exceed the maximum safety rating of the insulation at the inverter 164. (e.g., 600V). The node controller 180, however, senses the DC voltage rising, and when it approaches the first predetermined voltage (i.e., 550 volts), it begins to connect (switch) some more of the strings to parallel operation. As the PV arrays connected in parallel, the voltage drops to 420V, and the output will be approximately >=18 Kw. In another embodiment, the first predetermined voltage is a predetermined voltage below the maximum safety rating of the inverter 164. In this regard, if the predetermined voltage is 75 volts and the maximum safety rating of the inverter 164 is 600 volts, then the first predetermined voltage is 525 volts (600−75=525 volts).

As sun continues to rise, the intensity increases to ~210V per PV array. If all of the PV arrays remained in series, the total string voltage would exceed the maximum safety rating of the insulation of the conductors at the inverter, or ~600V (In North America). However, the DC sensing input with AI and/or the node controller 180 will sense the DC voltage rising, and when approaches the first predetermined voltage, it begins to connect (or switch) some more of the strings to parallel operation. As the PV arrays are now connected in parallel, the voltage drops to 420V, and the output will be approximately >=75 Kw (this is an approximation guess, without the math and experimentation with different types of PV panels). At this point the arrays should be all connected in Parallel, DC voltage should be above 500 VDC. The configuration in which all the PV arrays 152 are connected in series is illustrated in connection with FIG. 6.

If it becomes cloudy, rains or snows during the day, conventional prior art inverters (like the inverter 106 of FIG. 1) will shut down below 250-300 VDC, a high performance inverter shuts down below 100V, but all will be running at low efficiency at bottom of their respective power curves. In contrast to prior art PV systems, node controller 180 senses a drop in DC Buss voltage, and begins to series-switch some of the arrays (and or array strings) at random, (additionally to even-out the wear and tear on the individual switching components) to bring DC voltage up to as close to 450V as possible, could even go to full-series connection, similar to morning operation.

Once the condition begins to clear, the system will operate as though the sun is coming up in the morning. The expert system, will learn how the array performs during these instances, and will ultimately be able to predict the outcome of a given event, thereby allowing action to be taken proactively as opposed to reactively with the appropriate cautions to safety, but with enhanced speed, and incremental decrease in losses due to cycle time, and decision making based on inputs.

The evening operation sequence is simply the opposite of the morning operation sequence. And the night sequence, is simply that the PROPPS 150 is at rest, which means all PV arrays 152 are connected in series (shown in FIG. 4).

In certain moonlight and high streetlight ambient light conditions, node controller 180 in an exemplary embodiment, aggregates the output voltage by all of the PV arrays, which further conditioned by the DC-DC converter. In these scenarios where the PV arrays receive high levels of ambient streetlight or moonlight, the node controller 180 connects the PV arrays in series with each other such that output voltage of the array switchbox 156 will be sufficient to wake up a conventional inverter to sell Power to the grid. In the embodiment illustrated in FIG. 3, using low DC threshold, the VLA (very large Arrays) PV arrays will be operational on many nights.

Figure 7:
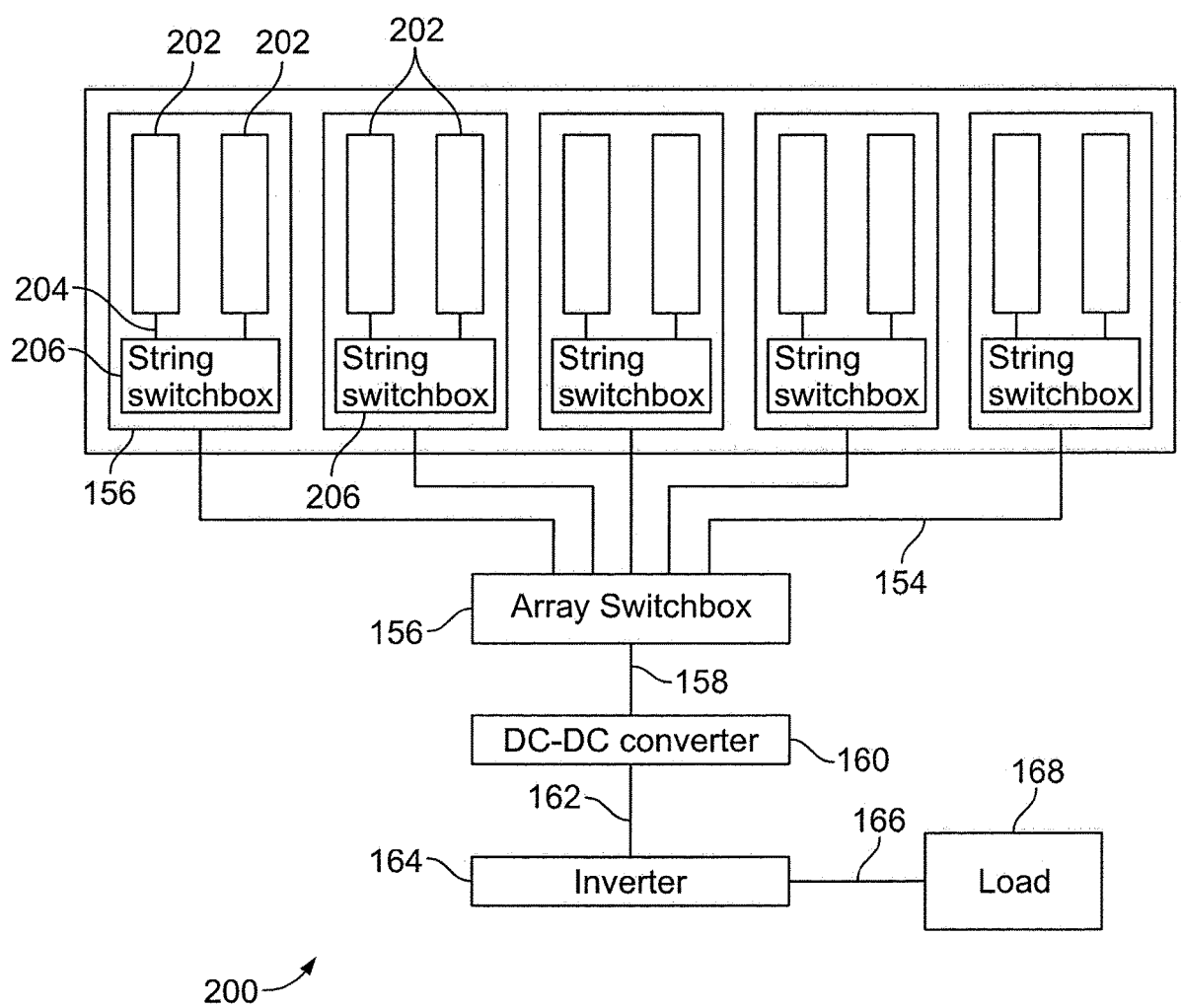
FIG. 7 is a block diagram of the PROPSS according to an alternative embodiment.

FIG. 7 is an alternative embodiment of PROPPS 150. As shown in FIG. 7, PROPPS 200 now includes additional plurality of PV strings 202, a plurality of DC links 204 and a plurality of string switch boxes 206. FIG. 7 includes many of the same components illustrated in FIG. 2 such as the array switch box 156, the DC to DC converter 160, the inverter 164 and the load 168. The string switch box 206 functions in the same manner as the array switch box 156. The string switch box 206 connects one or more PV strings in series or in parallel to each other based on the output voltage as produced by string switch box 206 on the DC links 154.

Figure 8:
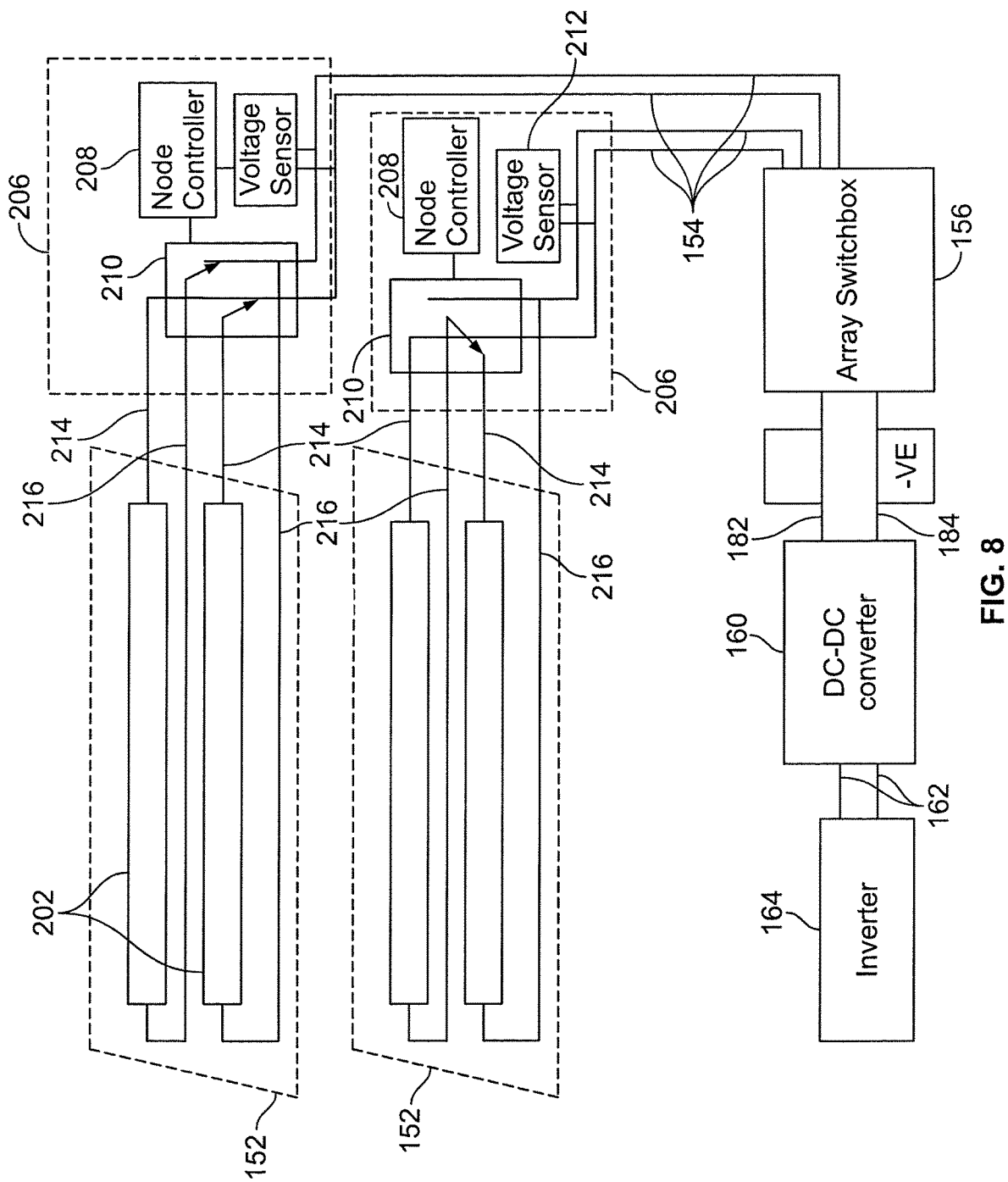
FIG. 8 is a block diagram showing inner components of the string switchbox in the alternative embodiment.

FIG. 8 illustrates the inner-components of string switchbox 206. String switchbox 206 has the same components as array switchbox 150. In particular, string switch box 206 includes a node controller 208, a node 210, and a voltage sensor 212. The node controller 208 in FIG. 7 operates in the same manner as a node controller 180 in FIGS. 3-6. The node controller 208 and connects one or more PV strings 202 in series or in parallel based on the voltage sensed at DC link 154. As shown in FIG. 8, each PV string includes an DC input link 214 and a DC output link 216.

In one embodiment, if a single 6 Kw array consists of 40×170 watt power rated panels, that array has an aggregate DC power rating of 6.8 Kw. And if PV panels are 28V per panel (nominal voltage being produced), the array will consist of 2 strings (nodes) connected in parallel, where each string is a series connected string of panels of 20 panels per string (i.e., 28×20=560V DC at equivalent or max irradiation.) On other hand, if array is in low irradiation condition and is outputting only 200V, the combined output from the 2 strings (nodes) in parallel is below the threshold of the common inverter, which requires 250-300V to turn on. The overall inverter system output in this situation is 0V.

In the same embodiment or in a different embodiment, if the two 3.4 Kw strings at 200V each are switched to series connection, the voltage instantly becomes 400V and with the added boost from the DC-DC converter, the inverter is now able to operate in the middle of it's conversion range. The array level switch must be able to be controlled by main (node optimization array switching) logic (AI), to continually optimize DC buss voltage at Inverter DC input.

As each string can be monitored for DC output (using string level sensing) it is possible to use this system, to provide telemetry to a remote monitoring system, to predict the failure of a panel or series of panels in a string, by continuously comparing its performance to that of its neighbors in the same system. Further the AI (expert System Artificial Intelligence) could predict required maintenance and replacement and will self calibrate and continually optimize itself, based on the number of nodes connected to the array network, and how the nodes perform.

In one embodiment, the activation of the PROPPS units at any level (String or Array) by the AI and the control logic at the Nodal Array Combiner Switch level is carried out by an addressable FM (Mux-DeMUXed) addressed pulse superimposed over the connected DC line, using the DC on the DC link as a carrier Signal. In an alternative embodiment, the activation of the PROPPS units at any level (String or Array) by the AI and the control logic at the Nodal Array Combiner Switch level is carried out by hardwired connection back to array switch 156, which will contain the main AI control logic, The expert system will self calibrate and continually optimize itself, based on the number of nodes connected to the array network, and how the nodes perform.

In one embodiment, the power for node activation will be provided by the arrays and strings themselves, a simple zener diode voltage regulation circuit (or any other voltage regulation circuit, such as a switching or linear regulator adequate for the input, output, and power capacities needed)

may be employed to ensure that the switching control voltages do not vary above 12V as the string and Array voltage varies infinitely with irradiation.

Figure 9:
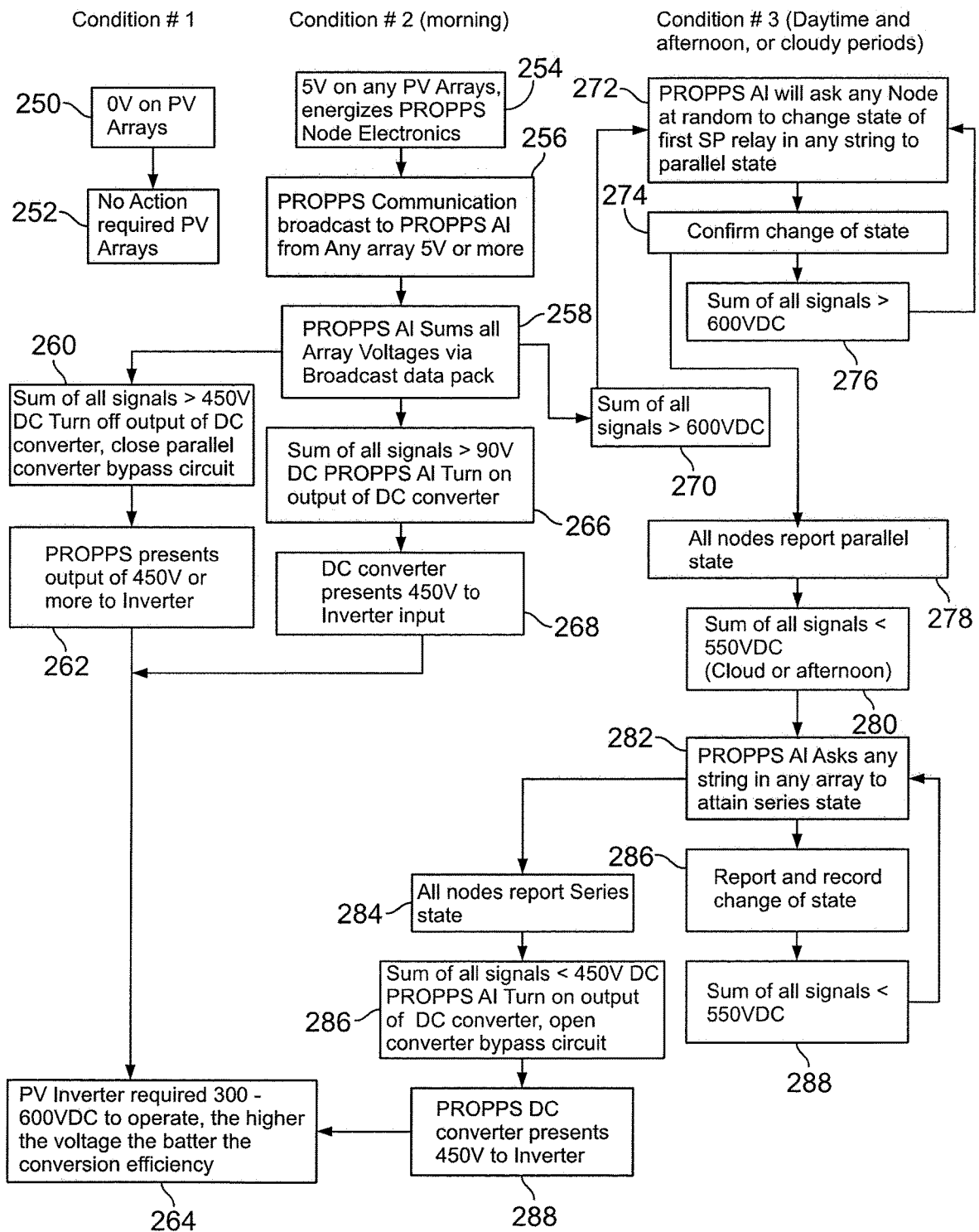
FIG. 9 is a flowchart of an exemplary method carried out by the PROPPS.

FIG. 9 is a flowchart of an exemplary method carried out by a node controller 180. The method begins when nodes 174 are in rest state and all PV arrays 152 are connected in series and are at rest and the PROPPS 150 has already learned the number of nodes that are connected to the node controller 174. As shown in FIG. 9, the method may be carried out in at least three different scenarios. The first scenario exists when the PV arrays 152 generate 0 volts. The second scenario is referred to as the morning operation sequence, which shows the steps taken by the node controller 180 as the sun rises. And the third scenario is referred to as the daytime, afternoon, or cloudy sequence, which begins at block 272. This sequence shows the steps taken by node controller 180 as the amount received the by PV arrays 152 varies during the day.

In the first scenario, the PV arrays 152 generate zero volts (block 250). At block 252, no action is required as zero volts is being sensed by node controller 180 as the PV arrays 152 are not generating any electricity.

The second scenario is the morning operation sequence. As shown in FIG. 9, the morning operation sequence begins at block 254, when five volts is generated by any of the PV arrays 152, which energizes the corresponding node electronics for that node 174 that is associated with the PV array 152 that generated the 5V. At block 256, those nodes 174 broadcast the amount of voltage being generated by any of the PV arrays 152 to node controller 180. At block 258, the node controller 180 sums all the voltages generated by the PV arrays 152. At block 260, when sum of all the signals is greater than 450 volts DC, node controller 180 turns off the output of the DC converter and closes the parallel converter by pass circuit. At block 262, node controller 180 presents an output of 450 volts to the inverter 164. At block 264, inverter 164 is operating within the appropriate operational range of 300 volts to 600 volts. The higher the voltage, the better the conversion efficiency; the lower the voltage, the less efficient the conversion efficiency.

Returning to block 258, the node controller 180 adds all of the array voltages generated by the PV arrays 152. At block 266, when the sum of all the signals from the PV arrays 152 is greater than 90 volts, the node controller 180 turns on the output of the DC converter. At block 268, the DC converter presents 450 volts to inverter 164 via the inverter link 162. However, at block 258, if the sum of all the signals generated by PV arrays 152 is greater than 600 volts (block 270), the method proceeds to 272. At block 272, the node controller 180 sends a command signal to one of the nodes 174 instructing at least one of the nodes 174 to transition into an active state. In effect, by changing the state of one of the nodes 174 to active state, the node controller 180 reduces the output voltage of the array switchbox 156.

At block 274, the node controller confirms the change of state of the node 174 for which the state was changed at block 272. At block 276, the node controller 180 sums the voltages generated by all of the PV arrays 152 and determines whether the sum of the generated voltages by the PV arrays 152 is greater than 600 V DC. If the sum of all signals is still greater than 600 volts, then the node controller 180 continues to send signals to nodes 174 and continues to connect the PV arrays 152 in parallel with each other until the sum of all the signals falls below 600 volts. When all of the nodes 174 report parallel state (at block 278), then sum of all voltages generated by the PV arrays 152 is less than 550 volts DC (block 280).

At block 282, the node controller 180 queries the plurality of nodes 174 to see if any of their PV arrays 152 are in series with each other. At block 286, the node controller 180 reports and records the change of state of the PV arrays and of the nodes 174 and at block 288, node controller 180 determines the sum of all signals as less than 550 volts.

Returning to block 282, node controller 180 determines whether any of the PV arrays 152 are in series state. At block 284, node controller 180 determines that all the nodes 174 are in series state and at block 286, if the sum of all the signals from the PV arrays is less than 450 volts, node controller 180 turns on the output of the DC converter and opens the converter by-pass circuit. At block 288, the node controller 180 presents an output of 450 volts to the inverter 164.

Figure 10:
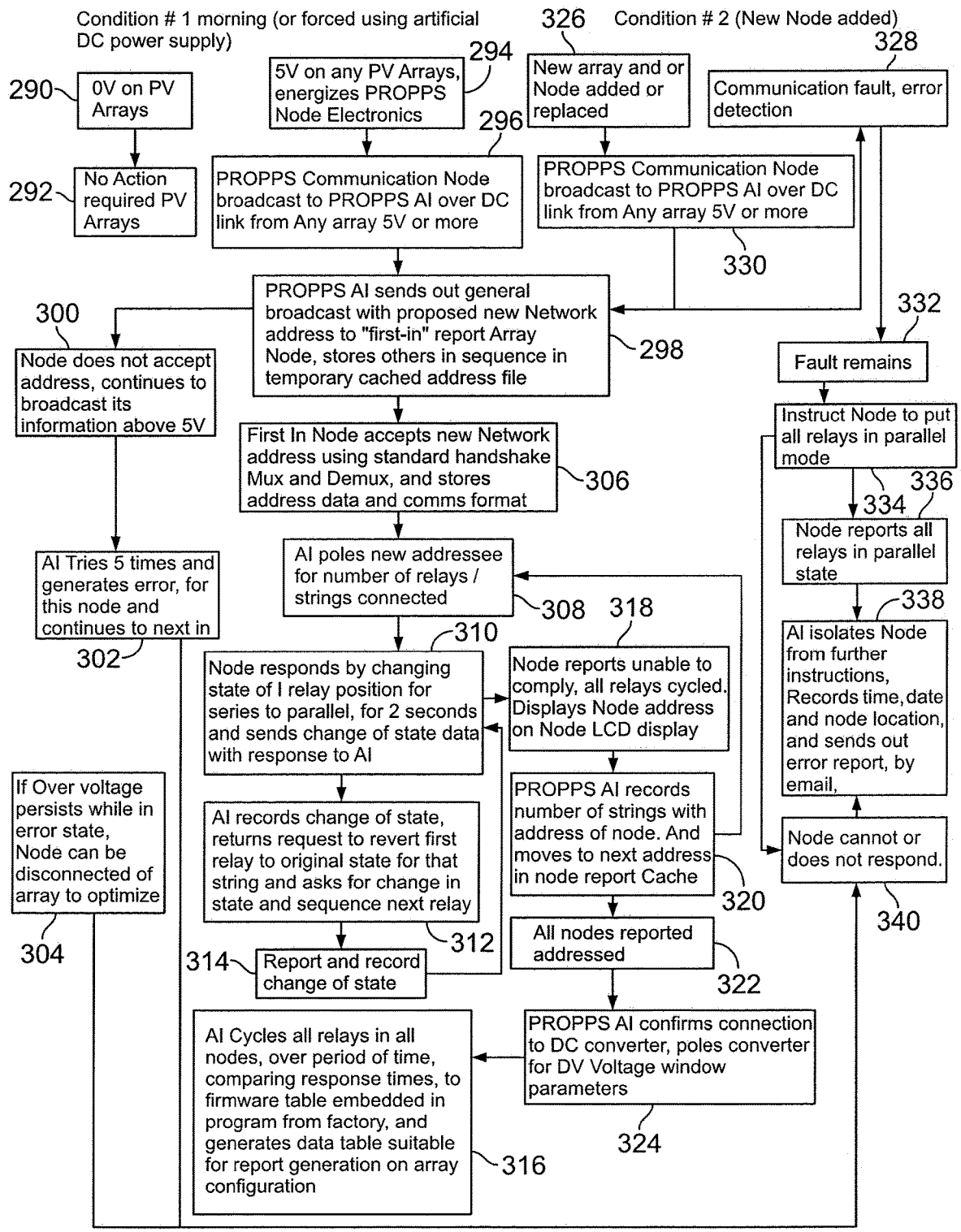
FIG. 10 is a flowchart of another exemplary method carried out by the PROPPS.

FIG. 10 is a flowchart of an exemplary method carried out by the node controller 180. In one embodiment, the method shown in FIG. 10 is carried out when the PROPPS 150 is in auto-configure mode wherein the node controller 180 attempts to configure all of the nodes 174 automatically at start-up. At start up, all PV strings in the PV arrays 152 are connected in series. In this method, the node controller attempts to learn the number of nodes in the PV system 150 and the number of strings that are connected to each node. The method shown in FIG. 10 may be carried out in at least two different scenarios. The first scenario exists in the morning when the inverter 164 is forced to use artificial DC power supply. The second scenario exists when a new node is added. The node controller 180 stores data relating to the nodes 174 and also stores in its data storage a list of nodes 174 to which the node controller 180 will attempt to communicate to.

At block 290, the PV arrays 152 generate zero volts. At block 252, no action is required as zero volts is being sensed by node controller 180 as the PV arrays 152 are not generating any electricity.

At block 294, when five volts is sensed at any of the nodes 174 (by way of PV arrays 152 generating electricity), node controller 180 energizes the node 174 for which five volts was sensed on. At block 296, one or more nodes 174 broadcast to node controller 180 at any point in time when five volts is more sensed by the one or more nodes 174. The node controller 180 at block 298 queries the list of nodes 174, stores the list in temporary cached file, and sends out a general broadcast with a proposed new network address to a first node 174 listed on the list. The node controller 180 also stores other in sequence in its temporary cache address file.

At block 300, the node 174 does not accept an address (sent to it by the node controller 180) and continues to broadcast its information. The node controller 180 at block 302 attempts to communicate with that node 174 for a predetermined number of times. In one embodiment, the node controller 180 attempts to communicate with the node 174 for at least five times. After the predetermined number of attempts, the node controller 180 generates an error for this node 174. The method proceeds to block 340, where the node controller 180 sets that node 174 as a node 174 for which it may not attempt to communicate with until the error is troubleshooted.

Returning to block 298, the node controller 180 sends out a general broadcast with a proposed new network address to the next node 174 on the list of nodes 174. At block 306, if the node 174 accepts a new network address. In one embodiment, the node 174 and the node controller 180 communicate via the controller links 186 using a standard handshake Mux-Demux format. In this embodiment, the node controller 180 stores the communication format the network address in a storage medium.

At block 308, the node controller 180 poles new addressee (i.e., the node 174 for which an address was most recently assigned at block 306) for a number of relays and strings connected to the node 174. At block 310, the node 174 responds by changing state of one relay position from series to parallel mode (from rest to active state) for two seconds. The node 174 sends the data associated with the state change to the node controller 180.

At block 312, node controller 180 records the change of state and returns request to revert the first relay to original state for that string and ask for change of state and sequence for the next relay associated with the node (from block 308). At block 314, the node controller stores the data associated with the change of state for the node (in blocks 308 and 310). The method then proceeds to block 310, where blocks 310, 312, and 314 are repeated until all of the relays associated with a given node have been addressed.

In the event that the node controller 180 is unable to address all of the relay switches for the plurality of nodes 174 after the node controller 180 has cycled through the plurality of nodes 174, the node controller 180 stores the location of those nodes 174 (and relay switches) for which could not be addressed. In one embodiment, the node controller 180 displays the information relating to the un-addressable nodes 174 on a liquid crystal display (LCD) associated with the node controller 180.

At block 320, the node controller 180 records the number of PV strings associated with any node 174 and moves to the node 174 that needs to be addressed. At block 322, the node controller 180 determines that all of the nodes 174 have been reported. And at block 324, the node controller 180 confirms the connection to the DC-DC converter 160 and poles the DC-DC converter 160 for DC voltage window parameters. The method then proceeds to block 316, where the node controller 180 cycles though all of the relay switches for the plurality of nodes 174 over a period of time. The node controller 180 compares response times to firmware table embedded in program from factory, and generates data table suitable for report generation on array configuration.

At block 326, a new array or new node 174 is added or replaced. At block 330, one or more nodes 174 broadcast to node controller 180 at any point in time when five volts is more sensed by the one or more nodes 174. The method then proceeds to block 298, which has been explained above.

At block 328, the node controller 180 detects a communication fault or detects an error associated with any of the nodes 174. At block 332, the fault or error remains. At block 334, the node controller 180 sends commands signals via the controller links 186 to change the state for all the nodes 174 into active state. In effect, all the relay switches associated with the plurality of nodes 174 are in parallel state. At block 336, the plurality of nodes 174 report that all of the relay switches associated with the plurality of nodes 174 are in parallel state. At block 338, the node controller 180 isolates and identifies the one or more nodes 174 from the plurality of nodes 174 that did not change state from series to parallel mode (because of the error/fault). Further, the node controller 180 records time, date, and node location for those nodes 174 at which a fault/error was detected (i.e., those nodes 174 for which a change of state was not recorded).

Similarly, at block 304, if the array switchbox 156 generates a voltage that is beyond the predetermined operational range of the inverter 164 while a node 174 is in error/fault mode, node controller 180 disconnects that node 174 from the array switchbox 156, which will allow the rest of the plurality of nodes 174 to optimize. The method proceeds to block 340, where the node controller 180 sets that node 174 as a node 174 for which it may not attempt to communicate with until the error is troubleshooted. At block 338, the node controller 180 isolates and identifies the one or more nodes 174 from the plurality of nodes 174 that did not change state from series to parallel mode (because of the error/fault). Further, the node controller 180 records time, date, and node location for those nodes 174 at which a fault/error was detected (i.e., those nodes 174 for which a change of state was not recorded).

Figure 11:
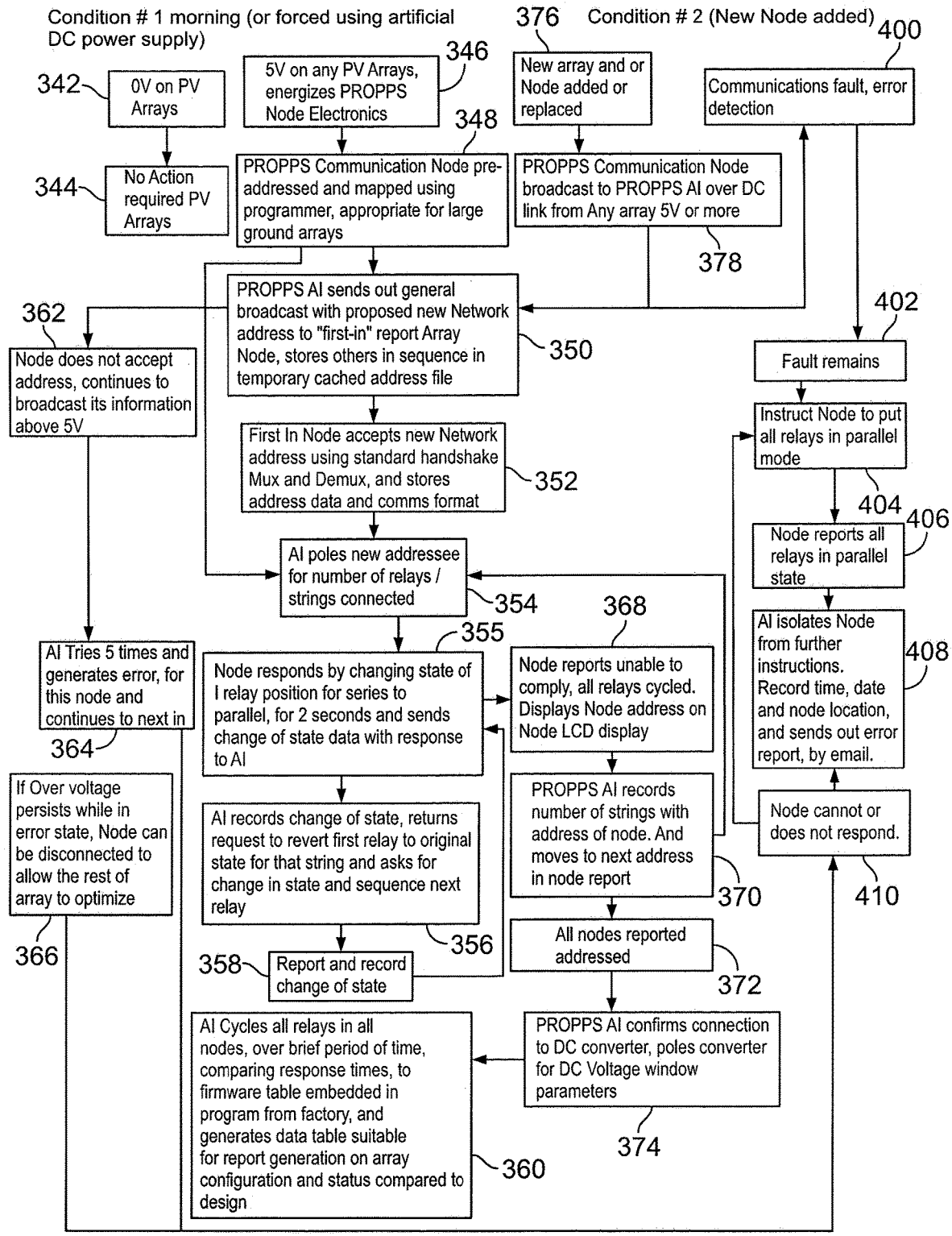
FIG. 11 is a flowchart of another exemplary method carried out by the PROPPS and It should be understood that the drawings are not necessarily to scale and that the embodiments are sometimes illustrated by graphic symbols, phantom lines, diagrammatic representations and fragmentary views. In certain instances, details which are not necessary for an understanding of the embodiments described and claimed herein or which render other details difficult to perceive may have been omitted. It should be understood, of course, that the embodiment described herein are not necessarily limited to the particular embodiments illustrated. Indeed, it is expected that persons of ordinary skill in the art may devise a number of alternative configurations that are similar and equivalent to the embodiments shown and described herein without departing from the spirit and scope of the claims.

FIG. 11 is a flowchart of an exemplary method carried out by the node controller 180. In one embodiment, the method shown in FIG. 11 is carried out when the PROPPS 150 is in manual-configure mode. At start up or when the PROPPS 150 is initialized, all PV strings in the PV arrays 152 are connected in series. In one embodiment, in this method, the node controller 180 is told how many nodes, and how many strings are connected to each node. The method shown in FIG. 11 may be carried out in at least two different scenarios. The first scenario exists in the morning when the inverter 164 is forced to use artificial DC power supply. The second scenario exists when a new node is added. The node controller 180 stores data relating to the nodes 174 and also stores in its data storage a list of nodes 174 to which the node controller 180 will attempt to communicate to.

At block 342, the PV arrays 152 generate zero volts. At block 344, no action is required as zero volts is being sensed by node controller 180 as the PV arrays 152 are not generating any electricity.

At block 346, when five volts is sensed at any of the nodes 174 (by way of PV arrays 152 generating electricity), node controller 180 energizes the node electronics for node 174 for which five volts was sensed on. At block 348, the node controller 180 maps pre-addressed nodes 174 using programmer, for large ground arrays.

At block 350, the node controller 180 queries the list of nodes 174, stores the list in temporary cached file, and sends out a general broadcast with a proposed new network address to a first node 174 listed on the list. The node controller 180 also stores other in sequence in its temporary cache address file.

At block 362, the node 174 does not accept an address (sent to it by the node controller 180) and continues to broadcast its information. The node controller 180 at block 362 attempts to communicate with that node 174 for a predetermined number of times. In one embodiment, the node controller 180 attempts to communicate with the node 174 for at least five times. After the predetermined number of attempts, the node controller 180 generates an error for this node 174. The method proceeds to block 410, where the node controller 180 sets that node 174 as a node 174 for which it may not attempt to communicate with until the error is troubleshooted.

Returning to block 350, the node controller 180 sends out a general broadcast with a proposed new network address to the next node 174 on the list of nodes 174. At block 352, if the node 174 accepts a new network address. In one embodiment, the node 174 and the node controller 180 communicate via the controller links 186 using a standard handshake Mux-Demux format. In this embodiment, the node controller 180 stores the communication format the network address in a storage medium.

At block 354, the node controller 180 poles new addressee (i.e., the node 174 for which an address was most recently assigned at block 306) for a number of relays and strings connected to the node 174. At block 355, the node 174 responds by changing state of one relay position from series to parallel mode (from rest to active state) for two seconds. The node 174 sends the data associated with the state change to the node controller 180.

At block 356, node controller 180 records the change of state and returns request to revert the first relay to original state for that string and ask for change of state and sequence for the next relay associated with the node (from block 308). At block 358, the node controller stores the data associated with the change of state for the node (in blocks 308 and 310). The method then proceeds to block 310, where blocks 310, 312, and 314 are repeated until all of the relays associated with a given node have been addressed.

In the event that the node controller 180 is unable to address all of the relay switches for the plurality of nodes 174 after the node controller 180 has cycled through the plurality of nodes 174, the node controller 180 stores the location of those nodes 174 (and relay switches) for which could not be addressed. In one embodiment, the node controller 180 displays the information relating to the unaddressable nodes 174 on a liquid crystal display (LCD) associated with the node controller 180 (block 368).

At block 370, the node controller 180 records the number of PV strings associated with any node 174 and moves to the node 174 that needs to be addressed. At block 372, the node controller 180 determines that all of the nodes 174 have been reported. And at block 374, the node controller 180 confirms the connection to the DC-DC converter 160 and poles the DC-DC converter 160 for DC voltage window parameters. The method then proceeds to block 360, where the node controller 180 cycles though all of the relay switches for the plurality of nodes 174 over a period of time. The node controller 180 compares response times to firmware table embedded in program from factory, and generates data table suitable for report generation on array configuration.

At block 376, a new array or new node 174 is added or replaced. At block 378, one or more nodes 174 broadcast to node controller 180 at any point in time when five volts is more sensed by the one or more nodes 174. The method then proceeds to block 350 (explained above).

At block 400, the node controller 180 detects a communication fault or detects an error associated with any of the nodes 174. At block 402, the fault or error remains. At block 404, the node controller 180 sends commands signals via the controller links 186 to change the state for all the nodes 174 into active state. In effect, all the relay switches associated with the plurality of nodes 174 are in parallel state. At block 406, the plurality of nodes 174 report that all of the relay switches associated with the plurality of nodes 174 are in parallel state. At block 408, the node controller 180 isolates and identifies the one or more nodes 174 from the plurality of nodes 174 that did not change state from series to parallel mode (because of the error/fault). Further, the node controller 180 records time, date, and node location for those nodes 174 at which a fault/error was detected (i.e., those nodes 174 for which a change of state was not recorded).

Similarly, at block 366, if the array switchbox 156 generates a voltage that is beyond the predetermined operational range of the inverter 164 while a node 174 is in error/fault mode, node controller 180 disconnects that node 174 from the array switchbox 156, which will allow the rest of the plurality of nodes 174 to optimize. The method proceeds to block 410, where the node controller 180 sets that node 174 as a node 174 for which it may not attempt to communicate with until the error is troubleshooted. At block 408, the node controller 180 isolates and identifies the one or more nodes 174 from the plurality of nodes 174 that did not change state from series to parallel mode (because of the error/fault). Further, the node controller 180 records time, date, and node location for those nodes 174 at which a fault/error was detected (i.e., those nodes 174 for which a change of state was not recorded).

Although the PV power optimization systems described herein have been described in considerable detail with reference to certain embodiments, one skilled in the art will appreciate that the Power optimization systems described and claimed herein can be practiced by other than those embodiments, which have been presented for purposes of illustration and not of limitation. Therefore, the spirit and scope of the appended claims should not be limited to the description of the embodiments contained herein.

I claim:

1. A system comprising an array switchbox; and
a plurality of automatic switchboxes, coupled to a PV array, wherein the PV array comprises a plurality of combined series connected PV devices within a physical PV power generating installation for automatically connecting one or more series connected PV devices wherein each of the series connected PV devices is connected to a respective one of the plurality of string switchboxes internally in series or in parallel with each other in a photo-voltaic (PV) power generation system, each one of the plurality of string switchbox comprising:

an input portion, an output portion, and a pair of positive and negative polarity direct current (DC) bus lines coupling the input portion to the output portion, wherein the input portion is capable of receiving DC power from a plurality of strings of series connected PV devices within the array, wherein each of the plurality of strings connected to one of the plurality of automatic switchbox connected to a respective input of the array switchbox, and the array switchbox comprising a respective node coupled to each respective input of the array switchbox;

the array switchbox comprising an artificial-intelligence (AI) enabled processor, wherein the AI enabled processor is capable of remembering various discreet and plural voltage conditions within a node or within a group of nodes as a heuristic hive of PV nodes, all residing within the nodes of the connected arrays of strings of PV devices;

a voltage sensor, wherein each voltage sensor is assigned to the output of a string, or group of series connected PV devices, the output of each voltage sensor's data is dynamically and intelligently linked to AI enabled processor residing within the switchbox and containing heuristic learning algorithms combined in an Artificial Intelligence Expert system (AIES);

wherein the combined and managed output of the node is further coupled to a pair of bus lines at the output portion, further comprising a first plurality of strings within the first node configured to each node of the first plurality of nodes for alternative coupling of one or more strings of series connected PV devices either in parallel or in series with each other based at least in part on the mathematically combined output voltages of the totality of the connected strings comprising the nodes; and wherein each node is associated with any two or more strings of series connected PV devices having a plurality of blocking and bypass diodes.

2. The system of claim 1, further comprising an automatic node controller for controlling the connections of the strings within nodes based on the voltage sensed by the voltage sensor at the output portion, wherein the node controller is electrically coupled to the voltage sensor and to the first plurality of nodes.

3. The system of claim 1, wherein the pair of bus lines include a positive direct current (DC) bus line and a negative DC bus line, the DC bus lines being capable of receiving power generated from the plurality of strings of series connected PV devices; and wherein the input portion comprises a plurality of input links and a corresponding plurality of output links, wherein each input link and corresponding output link is associated with a single PV device; and wherein each node is connected to an input DC link of one PV device and an output DC link of another PV device; and wherein the voltage sensor is connected to the pair of bus lines at the output portion.

4. The system of claim 3, wherein a quantity of the first plurality of nodes comprises n nodes and a quantity of PV devices comprises (n+1) PV devices.

5. The system of claim 4, wherein an $n^{th}$ node is connected to both an output link of an $n^{th}$ PV device and an input link of an $(n+1)^{th}$ PV device.

6. The system of claim 5, wherein the $n^{th}$ node is configured to selectively couple the output link of the $n^{th}$ PV device either to the negative DC bus line or to the input link of the $(n+1)^{th}$ PV device and wherein the $n^{th}$ node is configured to selectively either connect the input link of the $(n+1)^{th}$ PV device to the positive bus line or disconnect the input link of the $(n+1)^{th}$ PV device from the positive bus line.

7. The system of claim 6, wherein the $n^{th}$ node is configured to operate in an active state or a rest state, wherein when the $n^{th}$ node is in the active state, the $n^{th}$ PV device is connected in parallel with one or more PV devices and when the $n^{th}$ node is in the rest state, then the $n^{th}$ PV device is connected in series with one or more PV devices; and wherein when the nth node is in the active state, the output link of the $n^{th}$ PV device is coupled to the negative bus line and the input link of the $(n+1)^{th}$ PV device is coupled to the positive bus line; and wherein when the $n^{th}$ node is in the rest state, the output link of the $n^{th}$ PV device is coupled to the input link of the $(n+1)^{th}$ PV device and the input link of the $(n+1)^{th}$ PV device is disconnected from the positive bus line.

8. The system of claim 7, wherein any node includes at least one double pole single throw, electro-mechanical or solid state latching relay switch for every two connected PV devices comprising a first contact and a second contact, wherein the first contact and the second contact are interlocked so that they move in unison.

9. The system of claim 8, wherein the first contact of an $n^{th}$ node is connected to the output link of the $n^{th}$ PV device and the second contact of an $n^{th}$ node is connected to the input link of the $(n+1)^{th}$ PV device.

10. The system of claim 9, wherein the first contact of an nth node is configured to selectively couple the output link of the $n^{th}$ PV device either to the negative DC bus line or to the input link of the $(n+1)^{th}$ PV device; and second contact of an $n^{th}$ node is configured to selectively either connect the input link of the $(n+1)^{th}$ PV device to the positive bus line or disconnect the input link of the $(n+1)^{th}$ PV device from the positive bus line.

11. The system of claim 10, wherein when the first contact of an $n^{th}$ node is coupled to the negative bus line, the interlocked second contact of the $n^{th}$ node is coupled to the positive bus line, the $n^{th}$ PV device is connected in parallel with one or more PV decives;

and wherein when the first contact of an $n^{th}$ node is coupled to the input link of the $(n+1)^{th}$ device, the interlocked second contact is disconnected from the positive bus line, the $n^{th}$ PV device is connected in series with one or more PV devices.

12. The system of claim 1, wherein the plurality of PV devices comprises a plurality of PV modules permanently connected in series that convert light into electricity, and wherein the plurality of PV devices are selected from the group consisting of PV arrays.

* * * * *